United States Patent [19]

Manteghi

[11] Patent Number: 5,710,695
[45] Date of Patent: Jan. 20, 1998

[54] LEADFRAME BALL GRID ARRAY PACKAGE

[75] Inventor: Kamran Manteghi, Manteca, Calif.

[73] Assignee: VLSI Technology, Inc., San Jose, Calif.

[21] Appl. No.: 553,113

[22] Filed: Nov. 7, 1995

[51] Int. Cl.$^6$ .............. H05K 1/03; H05K 5/04; H01L 23/495

[52] U.S. Cl. .............. 361/813; 174/252; 174/257; 257/675; 257/707; 257/738; 361/717; 361/718; 361/764

[58] Field of Search .............. 174/52.1, 52.4, 174/250, 252, 255, 256, 257, 260; 228/180.22; 257/666, 672, 673, 675, 676, 677, 697, 699, 700, 784, 706, 707, 708, 712, 713, 723, 737, 738, 778, 780; 361/704, 707, 709, 712, 715, 717, 718, 719, 720, 761, 764, 760, 783, 779, 807, 813, 820; 437/220, 221, 209; 439/68, 70, 71, 83, 69, 72, 74, 485, 487

[56] References Cited

U.S. PATENT DOCUMENTS

| | | | |
|---|---|---|---|
| 4,410,927 | 10/1983 | Butt | 361/723 |
| 5,103,292 | 4/1992 | Mahulikar | 257/697 |
| 5,133,495 | 7/1992 | Angulas et al. | 228/180.1 |
| 5,137,845 | 8/1992 | Lochon et al. | 437/183 |
| 5,147,084 | 9/1992 | Behun et al. | 228/56.3 |
| 5,261,155 | 11/1993 | Angulas et al. | 29/830 |
| 5,276,964 | 1/1994 | Anderson, Jr. et al. | 29/853 |
| 5,337,219 | 8/1994 | Carr et al. | 361/794 |
| 5,341,980 | 8/1994 | Nishikawa et al. | 228/205 |
| 5,409,865 | 4/1995 | Karnezos | 437/210 |
| 5,578,869 | 11/1996 | Hoffman et al. | 257/730 |
| 5,610,799 | 3/1997 | Kato | 174/252 |
| 5,629,835 | 5/1997 | Mahulikar et al. | 174/252 |

OTHER PUBLICATIONS

"High–Pincount PBGAs Implementation" by Bruce Freyman and Michael Petrucci, Advanced Packaging Magazine, May/Jun. 1995.

"High Performance Package" Product Announcement by Olin Interconnect Technologies, Manteca, California, pp. 146–152.

"BGA Technology: Current and Future Direction For Plastics, Ceramic and Tape BGAs by David Walshak and Hassan Hashemi", MCC, Austin Texas, pp. 157–160.

"Ball Grid Array Packaging" by M.S. Cole and T. Caulfield, IBM Microelectroincs, Hopewell Junction, NY, pp. 147–152.

*Primary Examiner*—Donald Sparks
*Attorney, Agent, or Firm*—Patrick T. King

[57] ABSTRACT

A leadframe ball grid array package for packaging an integrated-circuit die includes a metallic substrate having a central portion and a leadflame having a plurality of inwardly-extending bonding fingers and a centrally-located open portion. The leadframe is directly attached to the metallic substrate by a non-conductive adhesive so that the open portion thereof overlies the central recessed portion of the metallic substrate. An integrated-circuit die is mounted in the central portion of the metallic substrate. The bonding fingers are disposed peripherally surrounding the integrated-circuit die. Bonding wires are interconnected between bonding pads formed on the integrated-circuit die and the plurality of bonding fingers. A solder mask is disposed over the top surface of the leadframe so as to form selective solderable areas. Solder balls are attached to the selective solderable areas. A plastic material or a lid is applied over the top surface of the die, bonding fingers and bonding wires.

14 Claims, 2 Drawing Sheets

LEADFRAME BALL GRID ARRAY PACKAGE

BACKGROUND OF THE INVENTION

This invention relates generally to semiconductor integrated circuit packages and more particularly, it relates to an improved leadframe ball grid array (BGA) package which has the ability of dissipating a larger amount of heat.

In recent years, there has existed a high level of interest in the area of ball grid array (BGA) package and assembly technology. The reason for this is that the package and interconnection industry has moved away from the use of pins as connectors for electronic packaging due to the high cost of fabrication, the high failure of connections, and the limitations on the density of input/output pins. As a result, solder balls have been used which are superior to pins in the above areas as well as being surface mountable.

As is generally known heretofore, an integrated-circuit die is typically attached to a die-attach pad, which is located at the central region of a conventional leadframe. In particular, the leadframes may be manufactured in long strips of many individual units. These long strips can be made long enough in order to accommodate any number of lead frames. Further, the leadframes may be formed with carrier rails and guide holes for positioning the same during manufacturing. Each of the leadframes may include a plurality of internal and external leads, tie bars, and the die-attach pad. The die-attach pad provides a surface on which the die may be mounted. The leadframes may vary in their sizes dependent upon the size of the die and the number of connections required to be made to the die.

Conventional leadframe plating processes provide leadframes that have generally clean, non-reactive finishes. Thereafter, the die is mounted to the die-attach pad. Bonding pads are provided on the surface of the die and are connected to the internal leads of the leadframe by bonding wires in accordance with known conventional techniques. In order to provide the BGA package with good thermal dissipation characteristics, a substrate formed of a thermally-conductive electrically insulated material is either attached to the die-attach pad or is substituted for the die-attach pad so as to be joined directly to the die. To provide even more enhanced thermal characteristics, a conductive slug, made of copper or silicon carbide, is further adhesively secured to the backside of the substrate. The substrate is typically formed of a non-conductive, hermetic material such as, for example, ceramic, molded plastic, or other suitable material.

If it is necessary to insulate the copper slug from the ceramic substrate, an insulating layer is provided therebetween. Bonding wires are used to join the pads of the die to the bonding fingers at the internal leads of the leadframe. Next, the die, leadframe, copper slug, substrate, and associated connections are encapsulated in an encapsulating material such as a plastic molded compound. After encapsulating of the die and the leadframe with the plastic material, the solder balls are fixedly attached to the appropriate areas.

The integrated circuit package utilizing a ceramic substrate with a copper slug suffers from the disadvantages of being generally more expensive in cost, more complicated to manufacture, and more unreliable. It would therefore be desirable to provide a BGA package which is relatively simple to manufacture and assemble with currently existing industrial equipment and is low-cost to produce. It would also be expedient to provide a BGA package which is capable of dissipating a larger amount of heat.

SUMMARY OF THE INVENTION

Accordingly, it is a general object of the present invention to provide an improved BGA package which is relatively simple in its construction and is easy to manufacture and assemble.

It is an object of the present invention to provide an improved leadframe BGA package which includes a leadframe being directly attached onto the top surface of a metallic substrate by a non-conductive adhesive.

It is another object of the present invention to provide an improved leadframe BGA package which is capable of dissipating a larger amount of heat.

It is still another object of the present invention to provide an improved leadframe BGA package which eliminates the need for an expensive substrate with a copper slug attached.

In accordance with these aims and objectives, the present invention is concerned with the provision of a leadframe ball grid array package configuration for packaging an integrated-circuit die which includes a metallic substrate having a central portion. A leadframe is provided which has a plurality of inwardly-extending bonding fingers and a centrally-located open portion. The leadframe is directly attached onto the metallic substrate by a non-conductive adhesive so that the open portion thereof overlies the central portion of the metallic substrate. An integrated-circuit die is mounted in the central portion of the metallic substrate. The plurality of bonding fingers are disposed peripherally surrounding the integrated-circuit die.

Bonding wires are interconnected between bonding pads formed on the integrated-circuit die and the plurality of bonding fingers. A solder mask is disposed over the top surface of the leadframe so as to form selective solderable areas. Solder balls are attached to the selective solderable areas. A plastic material is molded over the top surface of the die, bonding fingers and bonding wires.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
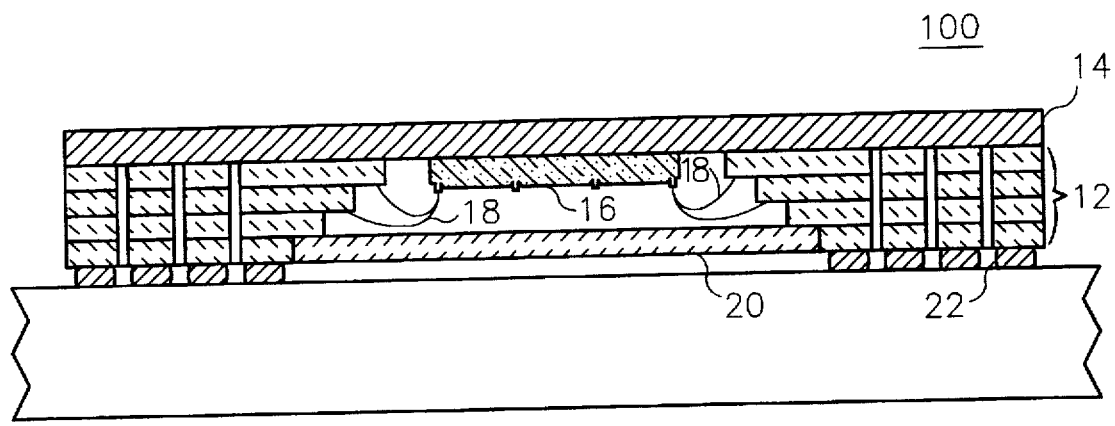
FIG. 1 is a sectional, elevational view of a prior art BGA package for an integrated-circuit utilizing a substrate with a copper slug attached thereto.

In FIG. 1 of the drawings, there is illustrated a sectional, elevational view of a conventional BGA (ball grid array) package 10 of the prior art which includes a thermally-conductive, electrically-insulated substrate 12. The substrate is formed of a non-conductive, hermetic material such as, for example, ceramic, molded plastic, or other suitable material. The substrate 12 is formed with a hollow center and has multiple tiers in order to facilitate wire bonding and routing. As depicted, the substrate 12 is fabricated in the form of a laminated structure. For improving the thermal performance of the BGA package, a copper slug 14 is adhesively attached to the backside of the substrate 12. It will be noted that this assembly is referred to as a "cavity-down" BGA package or enhanced BGA package which is unlike the conventional overmolded BGA.

The semiconductor die or chip 16 is connected directly to the central region of the copper slug 14 inside the cavity. Gold wire bonds 18 are used to interconnect the chip 16 to the laminated substrate 12. After the wire bonding process, the assembly may be either overcoated or a lid 20 may be affixed so as to cover the hollow center in order to provide for mechanical protection. Then, solder bumps or balls 22 are attached to appropriate areas on the top surface of the substrate 12.

As previously discussed, this prior art BGA package 10 suffers from the problem of higher cost in terms of material and is more complicated and unreliable to manufacture and assemble. The inventor of the present invention has developed an improved technique for fabricating a BGA package without the need of utilizing an expensive copper slug like that of the prior art of FIG. 1. As a result, there is provided an improved BGA package which is more reliable and is lower in cost to manufacture and assemble. Further, the present BGA package has the capability of higher power dissipation due to better heat transfer through the use of a metallic substrate.

Figure 2:
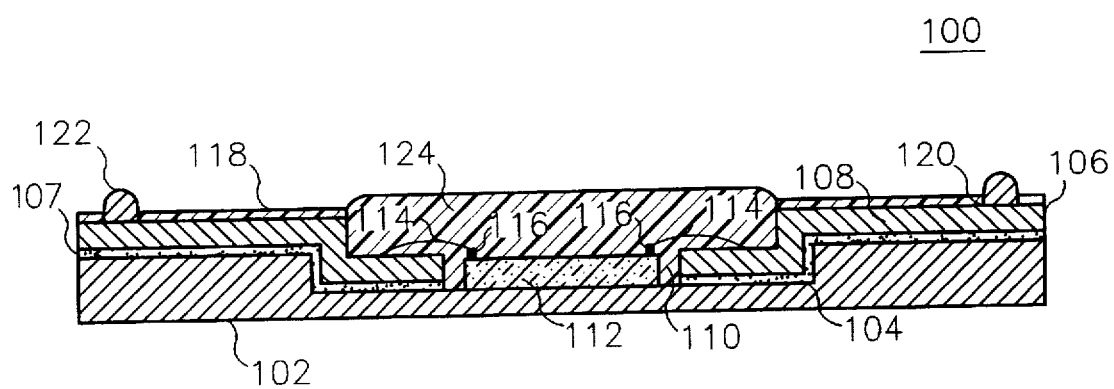
FIG. 2 is a sectional, elevational view of one embodiment an improved single layer BGA package, constructed in accordance with the principles of the present invention.

With reference to FIG. 2 of the drawings, there is shown an improved leadframe BGA (ball grid array) package 100 which is constructed in accordance with the principles of present invention. The BGA package 100 includes a substrate 102 which is formed of a metallic material such as aluminum or the like. The substrate 102 is typically anodized so as to produce an insulation layer. The substrate 102 has a recessed portion or cavity 104 formed in its central region. Alternatively, the substrate 102 may be formed without a cavity.

A leadframe 106 having a plurality of conductive leads 108 is directly attached onto the metallic substrate 102 via a non-conductive adhesive 107, such as an epoxy material and the like. The epoxy material is typically applied in liquid form atop the substrate 102 and is subsequently cured. The leadframe 106 is typically stamped or chemically etched from a sheet of leadframe material. The types of suitable leadframe material include copper, iron, nickel, aluminum or alloys containing these metals. Further, the conductive leads 108 may be plated with a highly conductive metal such as silver, copper, gold or palladium.

It will be noted that the leadframe 106 is non-conventional since it does not have a die-attach pad, but has a centrally-located open portion 110. A semiconductor integrated-circuit chip or die 112 is mounted in the central portion of the metallic substrate. The open portion 110 of the leadframe overlies the central recessed portion of the metallic substrate 102. The innermost ends of the conductive leads 108 are called bonding fingers. Very thin gold wires 114 are bonded between corresponding ones of bonding pads 116 formed on the top surface of the die 112 and corresponding ones of the bonding fingers on the leadframe 106. It should be understood to those skilled in the art that the bonding fingers extend inwardly toward the open portion 110 and are arranged so as to peripherally surround the die 112. Further, it can be seen that bonding fingers are off-set downwardly from the conductive leads so as to facilitate wire bonding.

After the mounting of the die 112 and the wire bonding process, a leadframe, and die subassembly is placed in a cavity and is hermetically sealed or encapsulated with a plastic epoxy compound 124. The encapsulating compound flows over the top surface of the die 112, the bonding fingers and bonding wires and fills the open portion 110 so as to form a glob top. Alternatively, a lid (shown in FIG. 4 below) may be affixed in a suitable manner in lieu of the encapsulation so as to provide mechanical protection. The encapsulating compound may, for example, be a standard molding compound such as provided by the Sumitomo Company as 6300 HS or HG molding compound, as 7320C low viscosity molding compound, or as HYSOL 4323 glob top. A solder mask 118 is applied, preferably using a screen printing or photo imaging procedure known in the art. During such a procedure, the entire top surface of the conductive leads 108 of the leadframe is covered with a material, except for selective solderable areas 120, where it is desired to have applied solder balls, and is subsequently cured. Thereafter, the solder balls 122 are attached to the selective solderable areas. The solder balls are covered with eutectic solder bumps, preferably 60% Sn and 40% Pb so as to reflow for joining the solder balls to the next-level board. One conventional technique which may be used for mounting the solder balls to the selective areas 120 on the top surface of the conductive leads 108 of the leadframe 106 is the so-called C-4 (controlled collapse chip connection) technology.

By comparing the prior art of FIG. 1 with the present invention of FIG. 2, it can be seen that there has been eliminated the use of a copper slug attached to the ceramic substrate and that the ceramic substrate has been replaced by a metallic substrate 102. Further, the metallic substrate 102 has directly attached thereto the leadframe 106 by utilizing a non-conductive adhesive 107. In this manner, the BGA package 100 of the present invention can dissipate higher amounts of heat due to the enhanced heat transfer via the metallic substrate 102. Further, the present BGA package for an integrated-circuit die can be manufactured and assembled at a lower cost with commercially available industrial equipment.

Figure 3:
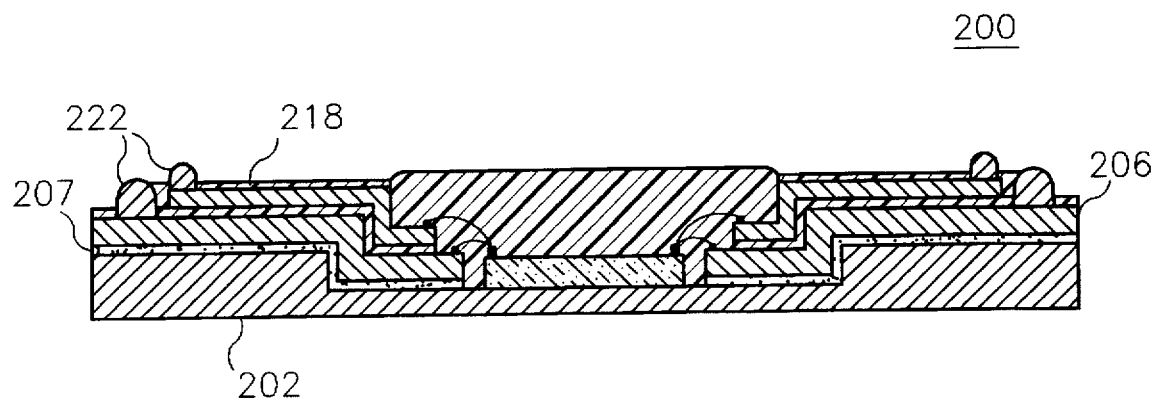
FIG. 3 is a sectional, elevational view of an improved multi-layer BGA package, constructed in accordance with the principles of the present invention.

In FIG. 3, there is illustrated a side-elevational view of a multi-layer BGA package 200 in accordance with the present invention. The multi-layer BGA package 200 is substantially identical to the BGA package 100 of FIG. 1, except that a plurality of leadframes 206 are used, each of the leadframes being secured to each other by a non-conductive adhesive 207, such as an epoxy material. Aside from this difference, the construction of the multi-layer BGA package 200 is identical to the package 100 of FIG. 2.

From the foregoing detailed description, it can thus be seen that the present invention provides an improved leadframe ball grid array package configuration for packaging an integrated-circuit die which has the capability of dissipating a higher amount of heat. The BGA package of the present invention includes a metallic substrate having a central portion and a leadframe having a plurality of inwardly-extending bonding fingers and a centrally-located open portion. The leadframe is directly attached onto the metallic substrate by a non-conductive adhesive so that the open portion thereof overlies the central portion of the metallic substrate. After the die attach and wire bonding process, a plastic material is molded or dispensed over the top surface of the die, bonding fingers and bonding wires or a lid is attached, and solder balls are attached.

Figure 4:
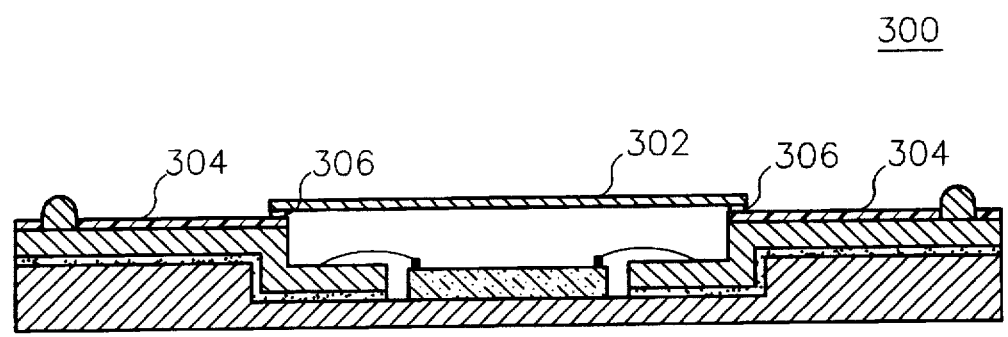
FIG. 4 is a sectional, elevational view of another embodiment of the invention.

FIG. 4 shows a BGA package 300 which is similar to the package shown in FIG. 2. The package 300 includes a metal or ceramic lid 302 which is fixed to cover the cavity found in the central region of the package. The lid 302 is fixed to a solder mask 304 with a layer 306 of suitable material, such as, for example, an adhesive.

What is claimed is:

1. A leadframe ball grid array package configuration for packaging an integrated-circuit die comprising:

a metallic substrate having a central recessed portion;

a leadframe having a plurality of inwardly-extending bonding fingers and a centrally-located open portion;

said leadframe being directly attached onto said metallic substrate by a non-conductive adhesive so that the open portion thereof overlies the central recessed portion of said metallic substrate;

an integrated-circuit die being mounted in the central recessed portion of said metallic substrate, said plurality of bonding fingers being disposed peripherally surrounding said integrated-circuit die;

bonding wires interconnected between bonding pads formed on said integrated-circuit die and said plurality of bonding fingers;

a solder mask being disposed over the top surface of said leadframe so as to form selective solderable areas; and solder balls being attached to said selective solderable area.

2. A leadframe ball grid array package configuration as claimed in claim 1, including a plastic material being applied over the top surface of said die, bonding fingers, and bonding wires.

3. A leadframe ball grid array package configuration as claimed in claim 1, including a lid fixed over the top surface of said die, bonding fingers, and bonding wires.

4. A leadframe ball grid array package configuration as claimed in claim 3, wherein said lid is metal.

5. A leadframe ball grid array package configuration as claimed in claim 3, wherein said lid is ceramic.

6. A leadframe ball grid array package configuration as claimed in claim 1, wherein said leadframe is stamped or chemically etched from a sheet of leadframe material.

7. A leadframe ball grid array package configuration as claimed in claim 6, wherein said leadframe material is a metal.

8. A leadframe ball grid array package configuration as claimed in claim 7, wherein said metal is selected from the group consisting of copper, iron, nickel, aluminum, and alloys thereof.

9. A leadframe ball grid array package configuration as claimed in claim 8, wherein said bonding fingers are plated with a highly conductive material.

10. A leadframe ball grid array package configuration as claimed in claim 9, wherein said highly conductive material is selected from the group consisting of silver and gold.

11. A leadframe ball grid array package configuration as claimed in claim 2, wherein said plastic material is selected from the group consisting of a molding compound and an epoxy encapsulant.

12. A leadframe ball grid array package configuration as claimed in claim 1, wherein said solder mask is applied by a process selected from the group consisting of a screen printing and a photo imaging process.

13. A leadframe ball grid array package configuration as claimed in claim 1, wherein said metallic substrate is comprised of aluminum which is anodized so as to form an insulating layer.

14. A leadframe ball grid array package configuration as claimed in claim 1, wherein said non-conductive adhesive is comprised of an epoxy material.

* * * * *